(12) United States Patent
Kruijswijk et al.

(10) Patent No.: US 7,230,675 B2
(45) Date of Patent: Jun. 12, 2007

(54) LITHOGRAPHIC APPARATUS, DEVICE MANUFACTURING METHOD AND DEVICE MANUFACTURED THEREWITH

(75) Inventors: Stefan Geerte Kruijswijk, Eindhoven (NL); Erik Roelof Loopstra, Heeze (NL)

(73) Assignee: ASML Netherlands B.V., Veldhoven (NL)

( * ) Notice: Subject to any disclaimer, the term of this patent is extended or adjusted under 35 U.S.C. 154(b) by 235 days.

(21) Appl. No.: 11/001,083

(22) Filed: Dec. 2, 2004

(65) Prior Publication Data
US 2006/0119812 A1 Jun. 8, 2006

(51) Int. Cl.
*G03B 27/42* (2006.01)

(52) U.S. Cl. .............................. 355/53; 355/72; 355/75; 378/34; 378/35; 250/492.1; 250/548

(58) Field of Classification Search .................. 355/53, 355/72, 75
See application file for complete search history.

(56) References Cited

U.S. PATENT DOCUMENTS

2005/0100831 A1* 5/2005 Finders et al. .............. 430/322

* cited by examiner

*Primary Examiner*—D. Rutledge
(74) *Attorney, Agent, or Firm*—Pillsbury Winthrop Shaw Pittman LLP

(57) ABSTRACT

The invention relates to a lithographic apparatus, a device manufacturing method and a device thus manufactured. The lithographic apparatus is of the scanning type, in which a target portion of a substrate is scanned through a patterned radiation beam. Inhomogeneities in the radiation beam may become visible in the form of stripes on the substrate. By imparting an additional movement to the substrate table and optionally to the patterning device of the apparatus, during scanning, in a direction at an angle with the scanning movement, such inhomogeneities are smeared out, and the overall homogeneity of the illumination may be improved.

18 Claims, 3 Drawing Sheets

LITHOGRAPHIC APPARATUS, DEVICE MANUFACTURING METHOD AND DEVICE MANUFACTURED THEREWITH

BACKGROUND OF THE INVENTION

1. Field of the Invention

The present invention relates to a lithographic apparatus, a method for manufacturing a device, and a device manufactured therewith.

2. Background of the Related Art

A lithographic apparatus is a machine that applies a pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of one or several dies) of a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction, to be discussed in more detail below) while synchronously scanning the substrate parallel or anti-parallel to this direction. It is also possible to transfer the pattern from the patterning device to the substrate by imprinting the pattern onto the substrate.

Imprinting may be carried out in a step-like way, wherein a stationary substrate is imprinted with a pattern from a stationary patterning device. An alternative way comprises scanning the substrate with a patterned beam. One of the known ways to do this is by way of pulsed illumination of the patterning device, and thus of the substrate. The image on the substrate may thus be built up of many pulsed illuminations of the patterning device, in such a way that the pulsed images overlap locally, and a sharp image is formed. This scanning type of illumination will be discussed more extensively below.

A problem with scanning type of illumination is that imperfections of the optical system may be imaged onto the substrate. These imperfections relate to those that cause the intensity, and thus the total received dose, as a function of position in the slit to be non-homogeneous, and in particular to those that extend across the radiation beam in the scanning direction. Such imperfections may be in the form of dust particles on an illuminator lens, inhomogeneities of the optical lens material, and in particular, e.g., reflections in an optional beam delivery system or other optical element such as a quartz rod or calcium fluoride rod, etc. A quartz (or calcium fluoride, etc.) rod with a square diameter is sometimes used to homogenize the supplied beam of radiation. The side faces and edges of the rod, and reflections thereof, may cause inhomogeneities in the radiation beam. Especially, but not only, imperfections in the radiation beam with a dimension in scanning direction of more than the distance over which the patterning device is displaced between two consecutive pulses would cause an overlap of their respective inhomogeneities, and thus a more visible straight line, although other types of imperfections causing stripes are not excluded.

Especially in the case of illuminating a substrate without using a patterning device, this may become visible in the form of stripes. Of course, in most practical cases, a patterning device will be used, but still the underlying basic radiation intensity will show such stripes, which may become visible on the actual substrate as a straight line of feature irregularities, parallel to the scanning direction.

In the prior art, this disadvantage has been reduced by adjusting the intensity profile by defocusing the illumination system, in order to smear out irregularities. However, this known measure does have disadvantages. For example, defocusing the illumination system causes the masking blades for the patterning device to be out-of-focus. Such masking blades are used to delimit the illumination field in order to prevent illumination of unwanted parts of the patterning device or substrate and to prevent scattered radiation. The masking blades thus define a so-called black border around the illuminated part of the patterning device. Because in practice the radiation in the radiation beam has a large angular distribution, these masking blades should be positioned close to the patterning device in order to not loose too much radiation. The masking blades thus being out of focus means that the definition of the black border is undesirably affected. Another disadvantage is that irregularities caused by the exposure lens, i.e., the lens between the patterning device and the substrate, cannot be reduced by this measure.

SUMMARY OF THE INVENTION

It is, inter alia, an object of the invention to provide an illumination system for delivering an improved illumination of a substrate.

According to an aspect of the invention, there is provided an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein at least said substrate table is moveable in a scanning direction with respect to said support, wherein, during projecting the patterned beam onto said target portion, said substrate table is moveable along a substrate table scanning path having at least one tangent thereto, at least one tangent including a non-zero angle with said scanning direction.

The substrate table being moveable along such a substrate table scanning path, in other words that is not always parallel to the scanning direction, allows a movement of the substrate table such that inhomogeneities no longer overlap to form stripes etc., but are smeared out into broader and/or less high peaks (or valleys) in the received dose. In the prior art, subsequent pulses given during a movement of the substrate table along the scanning direction causes inhomogeneities to overlap, while, according to the invention, a modulation in a direction that is non-parallel to the scanning direction, causes smearing out of the images corresponding to the pulses.

According to an aspect of the invention, there is provided a device manufacturing method comprising projecting a patterned beam of radiation onto a target portion of a substrate on a substrate table, wherein, during projecting said patterned beam onto said target portion, said substrate table is moved in a scanning direction, and along a substrate table scanning path having at least one tangent thereto, at least one tangent including a non-zero angle with said scanning direction.

According to an aspect of the invention, there is provided a device manufactured according to the method of the invention.

Advantageous embodiments of the invention are specified in the dependent claims.

DESCRIPTION OF THE DRAWINGS

Embodiments of the invention will now be described, by way of example only, with reference to the accompanying diagrammatic drawings in which corresponding reference symbols indicate corresponding parts, and in which.

DETAILED DESCRIPTION OF THE PRESENT INVENTION

Figure 1:
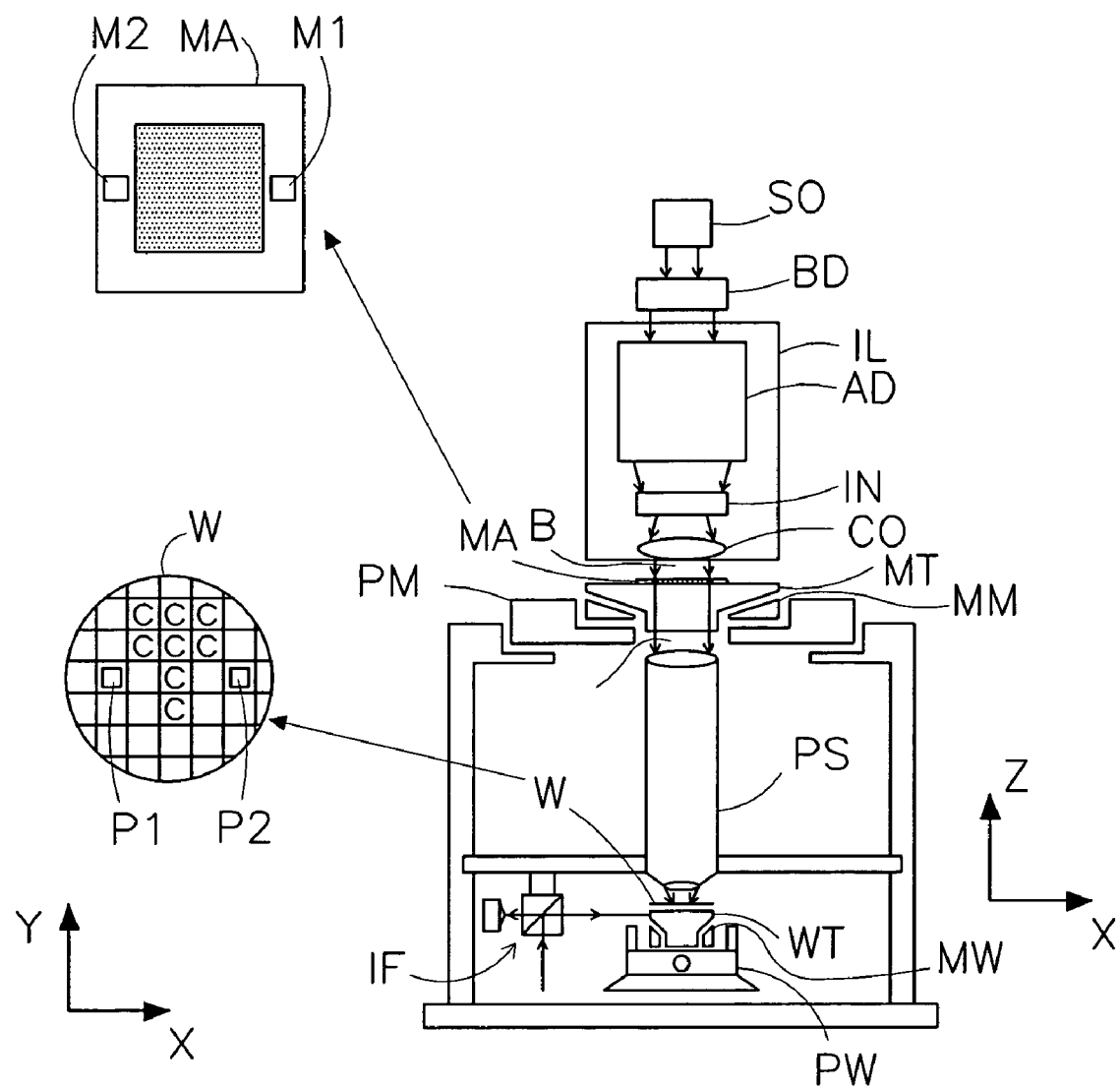
FIG. 1 diagrammatically depicts a lithographic apparatus according to an embodiment of the invention.

In all of the figures, similar parts are denoted with like reference numerals.

FIG. 1 diagrammatically depicts a lithographic apparatus according to one embodiment of the invention. The apparatus comprises:

- a source SO and a beam delivery system BD, both of which are optional;
- an illumination system (illuminator) IL configured to condition a radiation beam B (e.g., UV radiation or visible radiation);
- a support structure (e.g., a mask table) MT constructed to support a patterning device (e.g., a mask) MA and connected to a first positioner PM configured to accurately position the patterning device in accordance with certain parameters, as well as connected to a support modulator (e.g., a mask modulator) MM configured to modulate the position of the patterning device according to the invention;
- a substrate table (e.g., a wafer table) WT constructed to hold a substrate (e.g., a resist-coated wafer) W and connected to a second positioner PW configured to accurately position the substrate in accordance with certain parameters, as well as connected to a substrate table modulator (e.g., a wafer modulator) MW configured to modulate the position of the substrate table in accordance with the invention; and
- a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example, with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation beam source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the lithographic apparatus comprises a radiation beam source, for example when the source is a mercury lamp. Then the optical properties, such as positioning may be adapted optimally to the rest of the lithographic apparatus. The source SO and the illuminator IL, together with the beam delivery system BD if required, may be referred to as a radiation system.

The source SO or radiation system as a whole may provide a continuous beam of radiation. That is to say, during illumination of the substrate the illumination is continuous, while between illuminating a part of the substrate and another part of the substrate the beam of radiation may of course be blocked. In particular, and especially in the case of a scanning type of lithographic apparatus, to be elucidated below, the radiation beam source SO may comprise a pulsed radiation beam source.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW, the substrate table modulator MW and position sensor IF (e.g., an interferometric device, linear encoder or capacitive sensor), the substrate table WT can be moved accurately, e.g., during scanning or so as to position different target portions C in the path of the radiation beam B. Similarly, the first positioner PM, the support modulator MM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which may form part of the first positioner PM and/or the support modulator MM. Similarly, movement of the substrate table WT may be realized using a long-stroke module and a short-stroke module, which may form part of the second positioner PW and/or the substrate table modulator MW. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

2. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

It is in these scanning types of mode, and in the corresponding scanning lithographic apparatus, that the invention provides its advantages. Suppose, e.g., in the scan mode numbered "1" above, that the apparatus is a scanning lithographic apparatus with a scanning direction along the direction indicated x in FIG. 1. Herein, as in principle in all of this application, the scanning direction is to be taken as the direction, in the plane of the support or substrate, which is perpendicular to the radiation beam, and in particular perpendicular to both the (average) direction of propagation of radiation in the beam and to the largest dimension of the radiation beam's cross-section. The radiation beam in scan mode is most often a narrow beam having a cross-section substantially extending in e.g., the y-direction in FIG. 1, with only a small width in the perpendicular x-direction, such as X×Y=6×26 mm, or the like. Hence in this case, the scanning direction is the x-direction, i.e., perpendicular to the length or largest diameter. The invention proposes to add a modulation to the scanning path, such that inhomogeneities no longer overlap to form stripes etc., but are smeared out into broader and/or less high peaks (or valleys) in the received dose.

Thereto, the first positioner PM and the second positioner PW are configured to perform a scanning motion along said x-direction, taking into account (de)magnification and image reversal characteristics of the projection system PS, such that a sharp image is formed on the substrate W. Any imperfection in, e.g., the illuminator IL may become visible on the substrate W in the form of one or more stripes in scanning direction, or undesired feature variations that are aligned in scanning direction. Since the human eye is much more sensitive for such variations along a line than for random variations, it is desirable to suppress such illumination inhomogeneity.

Thereto, according to the invention, at least said substrate table is moveable in a scanning direction with respect to said support, while further, during projecting the patterned beam onto said target portion, said substrate table is moveable along a substrate table scanning path having at least one tangent thereto, at least one tangent including a non-zero angle with said scanning direction. The condition of at least one tangent to the substrate table scanning path including a non-zero angle with the scanning direction means that at least a part of the scanning path does not extend parallel to the scanning direction. Note that this non-parallel part may relate to a part of the substrate table scanning path that is traversed during active illumination, i.e., projecting, but may also relate to a part of the substrate table scanning path that is traversed between two partial illuminations, such as two or more scans of one and the same target portion. This will be explained further below. Note furthermore that the scanning direction is the main, or general, direction into which the substrate table, and optionally the support, is moved, and generally equals the direction perpendicular to the length or largest dimension of the often narrow radiation beam, as mentioned above. Put in other words, at least the substrate table WT is moveable in a modulation direction at a non-zero angle with said scanning direction during projection of the patterned beam onto the target portion of the substrate (e.g., for the mode numbered "2" above).

It is possible that only the substrate table is moveable and that the support is stationary, during projection, such as in scan mode "2" above. In this mode, movement and modulation of the substrate table is coupled to programming and control of the patterning device in the support, such that a sharp image on the substrate can still be ensured.

Advantageously, during projecting the patterned beam onto said target portion, the support is moveable in said scanning direction, along a support scanning path having at least one tangent thereto, at least one tangent including a non-zero angle with said scanning direction, e.g., to perform the mode numbered "1" above. Put differently, also the support is moveable in a direction parallel to said scanning direction, as well as in said modulation direction which is non-parallel to the scanning direction. This scan mode is often used in practice, and to ensure a sharp image of the patterning device in the support onto the substrate, the movements of the substrate table and the support can be appropriately coupled, i.e., be synchronous. Although generally this coupling is known, in order to obtain sharp images, the additional aspect of the modulation, and its effect on the coupling, will be elucidated further below.

When, during scanning, the substrate table WT is moved along the substrate table scanning path as described above, and optionally the support is moved along the support scanning path as described above, any imperfection of the illumination system IL or the projection system PS, such as a reflection of a side wall of a quartz rod or beam delivery system, or any other inhomogeneity, will be smeared out on the substrate W. In particular an inhomogeneity which in the prior art would have become visible as a narrow stripe, will now become a (much) wider stripe which is also (much) lower and less intense. In other words, the width of the stripe will be increased, while the peak height, in terms of received dose variation of the stripe with respect to the average received dose on the substrate, is much decreased. Both effects co-operate in making the stripes due to inhomogeneous illumination much less visible.

A device manufacturing method according to the invention comprises projecting a patterned beam of radiation onto a target portion of a substrate on a substrate table, wherein, during projecting said patterned beam onto said target portion, said substrate table is moved in a scanning direction, and along a substrate table scanning path having at least one tangent thereto, at least one tangent including a non-zero angle with said scanning direction. In particular, the lithographic apparatus according to the present invention, that allow such a movement in a modulation direction, are suitable for carrying out such device manufacturing method.

To ensure good control over the modulation movement(s), a separate drive that imparts a movement in a modulation direction are provided. Thus, the lithographic apparatus according to the invention may comprise at least a substrate table modulator MW that moves the substrate table WT in a modulation direction during projecting the patterned beam onto the target portion. Herein, the modulation direction may in principle be any direction in the plane of the substrate that is non-parallel to the scanning direction. In particular, it will be a direction perpendicular to the scanning direction, but any other non-zero angle with the scanning direction will also be effective. It may be that in each case the velocity with which the substrate table is moved in the modulation direction should be selected such that the substrate table actually follows the substrate table scanning path according to the invention. Hence, e.g., a perpendicular modulation direction implies a relatively low speed in the modulation direction, while e.g., a modulation that has a significant component in the scanning direction requires a relatively much higher velocity in the modulation direction in order to obtain a similar scanning path. Nevertheless, a suitable combination of modulation direction and velocity in said modulation direction, in order to come to a desired scanning path, may be easily determined by the skilled person.

The apparatus advantageously further comprises a support modulator MM that moves said support MT in said modulation direction during projecting the patterned beam onto the target portion. The same principles as described above apply to this support modulator MM, that is eminently suitable for carrying out a scanning illumination of the type "2" described above.

Advantageously, the substrate table scanning path and the support scanning path have similar shapes. In other words, the geometry of the paths should be similar, such that one of the substrate table scanning path and support scanning path is imaged by the projection system onto the other of the substrate table scanning path and the support scanning path. With this is meant that the projection system images the one onto the other, thereby ensuring that the projected image is still sharp as to the desired pattern on the target portion of the substrate.

The support MT, or mask table, and the substrate table WT are moved substantially synchronously along the support scanning path, the substrate table scanning path, respectively. Substantially synchronously is intended to mean that not only the scanning paths are similar, but also the velocity with which the support and substrate table move along their respective scanning paths. In other words, during projecting the radiation beam, the support scanning path is imaged by the projection system onto the substrate table scanning path. Hence the velocities of support and substrate table are also images of each other. The support modulator MM and the substrate table modulator WM are constructed accordingly, e.g., by way of an appropriate controller, such as interferometers.

Note that prior art lithographic apparatus may comprise a positioner for positioning the substrate and/or the patterning device in a direction perpendicular to the scanning direction. However, they are designed to only do this between scans, while during scans they are perfectly stationary in the non-scanning direction, i.e., they are constructed to move only in the scanning direction during scans.

Note in particular that the substrate table modulator MW according to the invention may be a separate drive of moving the substrate table WT, such as any desired type of actuator, but it is also possible that the substrate table modulator MW and the second positioner PW are in fact combined into one substrate table positioner, that is constructed to perform positioning in both the scanning direction and in the modulation direction. Similarly, said support modulator MM and said first positioner PM may be a separate drive for moving the support MT in the modulation direction, and the scanning direction, respectively, but it is also possible that said support modulator and said first positioner are combined into one support positioner.

Figure 2:
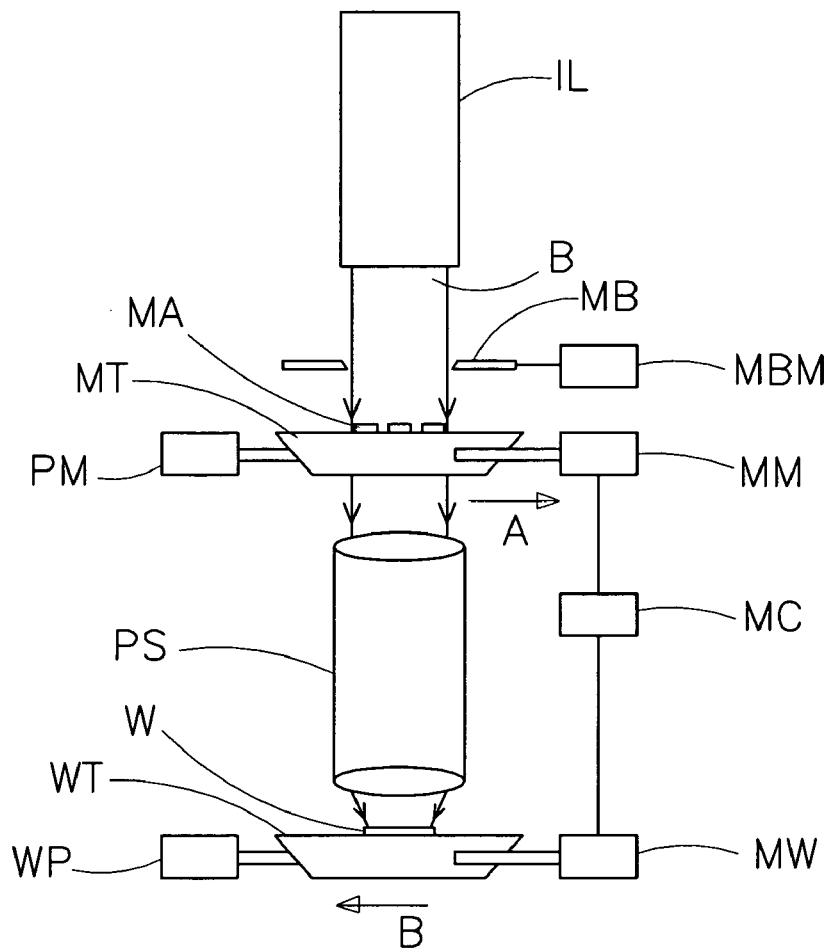
FIG. 2 diagrammatically shows a side elevation view of another embodiment of the lithographic apparatus according to the invention.

FIG. 2 diagrammatically shows a side elevation view of another embodiment of the lithographic apparatus according to the invention.

Herein, IL is an illuminator providing a radiation beam B, which is limited onto a patterning device M on a support MT by masking blades MB, which may be modulated by masking blades modulator MBM.

The support is movable in a scanning direction A, by way of a first positioner PM, and may be modulated in a direction A' (not indicated) at an angle with A by way of support modulator MM.

The beam B, after passing through the patterning device M and through a projection system PS, illuminate a substrate W on a substrate table, or wafer table, WT. The wafer table is moveable in a direction B, which is parallel to direction A, by a second positioner WP, and may be modulated by substrate table modulator MW in a direction B' (not shown) which is parallel to direction B. Note that in both cases the term parallel encompasses an anti-parallel movement, i.e., a movement in parallel but opposite directions, as indicated in FIG. 2.

The support modulator MM and the substrate table modulator MW are coupled to a modulation controller MC, which may also be coupled to the masking blades modulator and to the first and/or second positioner (not indicated).

When the lithographic apparatus performs a scanning illumination, the support MT is moved in the direction A by the first positioner PM. At the same time, the substrate table WT is moved in the direction B by the second positioner PW. Herein, the relative velocities are determined by the (de) magnification properties of the projection system PS, e.g., if PS has a magnification factor of 0.5 and produces a mirrored image, the velocity of the substrate table will be half as large as and opposite to the velocity of the support MT.

Additionally, the support modulator MM modulates the support MT in a modulation direction A' at a non-zero angle with direction A. This modulation direction A' has not been indicated in FIG. 2, but is also perpendicular to the direction of the beam B, and is hence generally in a direction out of the plane of the paper. Similarly, the substrate table modulator MW modulates the substrate table WT in a modulation direction B'. Again, the relative velocities of the modulation are determined by the same properties of the projection system, and in the above mentioned example, the modulation velocity of the support MT would be twice as large as that of the substrate table WT, and be in opposite directions.

Furthermore, since now the support MT is moved with respect to the substantially stationary radiation beam B not only in a scanning direction A, but also in a modulation direction, it may be desirable to also modulate the masking blades MB, by way of the masking blade modulator MBM. This will further ensure that the radiation beam B does not illuminate undesired parts of the patterning device M, for example outside a so-called chrome border, which is a layer of, e.g., chromium around the pattern. Note however that, e.g., in a case where the amplitude of the modulation is less than the margin of the chrome border, such additional modulation of the masking blades MB is not required. In fact, in the following, the masking blades MB and their possible modulation will be left out of the further discussion, unless a specific aspect requires such a discussion.

In order to couple the modulation by the support modulator MM and the substrate modulator MW, both the support modulator MM and the substrate table modulator MW, and optionally the masking blades modulator MBM (not indicated) may be coupled to a modulation controller MC. The modulation controller MC may be provided in the form of some electronic measuring and control system or the like, constructed to measure the modulation of the support MT and the substrate table WT, and controlling the modulation by adjusting where necessary, e.g., by a feedback loop. This latter embodiment of a modulation controller may, e.g., be used when the support modulator and/or the substrate table modulator impart a predetermined movement, such as a substantially uniform linear movement or a sinusoidal movement, or a predetermined irregular or noise-like movement. In such cases, the modulation being predetermined, it is possible to measure and control/correct the modulation by each of the support modulator and/or substrate table modulator independently. This allows effective mechanical decoupling of the support and the substrate, which may be desirable, e.g., to prevent unwanted transfer of vibrations etc. Generally, position and in particular modulation, may be controlled and measured using interferometers and the like. These allow a high precision over relatively long distances, and have a quick response.

Alternatively, the modulation controller MC may be provided in the form of a mechanical coupling, constructed to ensure that the ratio between the modulation of the support MT and the modulation of the WT corresponds to the (de)magnification properties of the projection system PS, to still ensure a sharp projected image.

E.g., in the case wherein use is made of actual random noise or any other non-predetermined basis for the modulation of the support MT and/or the substrate table WT, a coupling between the support modulator MM and the substrate table modulator MW is advantageous to prevent undesired blurring of the projected image. Here, the coupling may be directly mechanical or also by way of coupled control of the modulation, as described above.

Figure 3A:
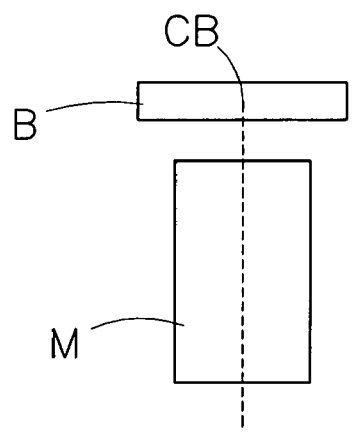
FIG. 3a diagrammatically shows the scanning path of a radiation beam across a patterning device in a prior art scanning process, while FIG. 3b diagrammatically shows said scanning path in a scanning method according to the present invention.
Figure 3B:
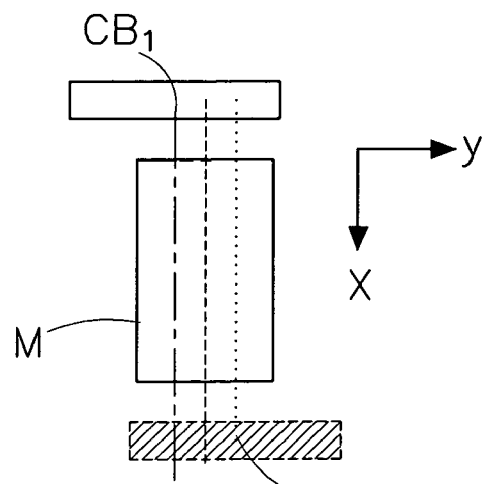

FIG. 3a diagrammatically shows the (support) scanning path of a radiation beam B across a patterning device M in a prior art scanning process, while FIG. 3b diagrammatically shows said (support) scanning path in a scanning method according to the present invention.

It is noted that in the following, only modulation of the patterning device, or support, is discussed. However, modulation of the substrate (table) may be performed in a similar fashion. In fact, in some methods and apparatus, it is only the substrate table which is modulated.

Generally, as depicted in FIG. 3a, in the prior art scanning process, the radiation beam is substantially centered with respect to the patterning device M. In other words the center of the beam CB travels along a line of symmetry of the patterning device M. This scanning path is indicated by a dashed line, and also indicates the scanning direction. Note that in fact it is most often the patterning device M which is scanned through the beam, although this is irrelevant for their relative movement as discussed here.

Contrarily, as depicted in FIG. 3b, in a process according to the invention, the patterning device M is scanned through the beam B twice. The first time the patterning device M is positioned in a first position, as indicated by the solid line, with the center of the beam $CB_1$ slightly to the left of the dashed line of symmetry of the patterning device. The scanning direction is parallel to said line of symmetry. After the first scan, the patterning device is shifted to a second position, over a predetermined distance in a direction perpendicular to the scanning direction. This second position is indicated by the hatched area with the dashed circumference. Here, the center of the beam $CB_2$ is positioned slightly to the right of the dashed line of symmetry. The second scan is performed along the dot-and-dash line, along the same scanning direction, but in an opposite sense.

In other words, in a particular embodiment of the present method, said substrate table is positioned in a first position, said patterned beam is projected onto said target portion for a first time, subsequently said substrate table is moved into a second position, and said patterned beam is projected onto said target portion for a second time. In this method, a scanning type of projection is advantageous, although it could also be used in a step-like projection.

Note that in this case the total illumination, or projection of the patterned beam comprises two, or optionally more, partial illuminations, connected by a translation between the respective positions. Although strictly speaking no radiation is projected during these translations, the terms 'illumination', 'during projection of the patterned beam' and equivalents are intended to encompass the complete action from the start of the first (partial) projection on a target portion until the end of the last partial projection on that same target portion. Of course, target portion always relates to one single IC or other individual end product, and not to a complete surface of a wafer etc.

By thus dividing up the scanning process, any irregularity or inhomogeneity is also divided up in two separate "stripes." This means that those two stripes are less high, less visible, since of course the received dose for each of the two scans is also smaller, generally but not necessarily, half the total dose. In this way, the illumination homogeneity is improved.

As shown in FIG. 3b, the first and second positions are substantially mirror images with respect to the dashed line of symmetry of the patterning device M. However, this is not necessary, as long as the intensity in the beam is substantially a constant over its length in y-direction. In that case, the exact first and second positions are irrelevant. In case the intensity in the beam B is not substantially a constant, the first and second positions may be selected such that the total received dose of the scans in first and second position add up to have a substantially constant value as a function of y, and of course also of x. In this way it is possible to design the intensity distribution in the beam B different from a simple constant, and thus be able to maximize the intensity. For example, take a trapezoid with a central plateau of highest intensity, which plateau is more narrow than the required scanning width in y-direction. As long as the distance between the first and second scanning positions is at least as large as the difference between the required scanning width and the width of the central plateau, the first and second positions may be selected such that the total intensity (or received dose) is constant over the required scanning width. Other possibilities will occur to the skilled person.

It is also possible to further improve the homogeneity by dividing up the scan into more than two partial scans, such as three scans, four scans, etc. Note, however, that the total scan time for each target portion also increases by a factor roughly equal to the total number of scans, unless the scanning speed is increased accordingly. Note furthermore that it is possible to combine the above method with other methods according to the invention, in short the modulation of the scanning path in a direction at an angle with the scanning direction. In fact, these other methods, to be discussed below, also come down to scanning at different positions, wherein these different positions are taken up during a single scan, preferably but not necessarily continuously.

FIGS. 4a through 4d show some examples of scanning paths according to the invention. In all cases, a radiation beam B has a center CB. A patterning device is indicated by M and is scanned through the beam B in the x-direction, while a modulation movement is performed in the y-direction. The scanning path of the center of the beam CB with respect to the patterning device M is in each case indicated by the dashed line.

Figure 4A:
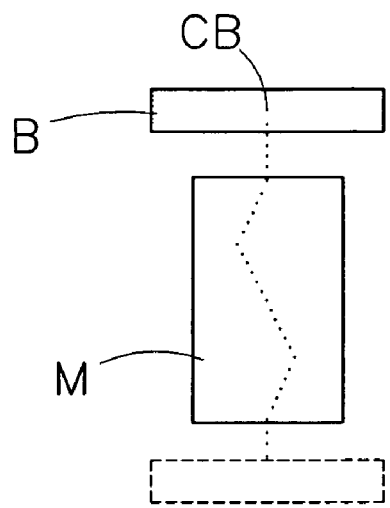
FIGS. 4a through 4d show some examples of scanning paths according to the invention.

FIG. 4a shows a scanning path comprising a number of substantially straight lines, together producing a kind of zigzag scanning path as indicated by the dashed line. By reversing the direction of the modulation movement during the scan, it is possible to use a higher velocity of the modulation movement without the patterning device M leaving the beam B. Particularly, in the case of strong but short-lived inhomogeneities, such scanning path, with its accompanying relatively high modulation velocities, allows effective smearing out of those inhomogeneities.

Figure 4B:
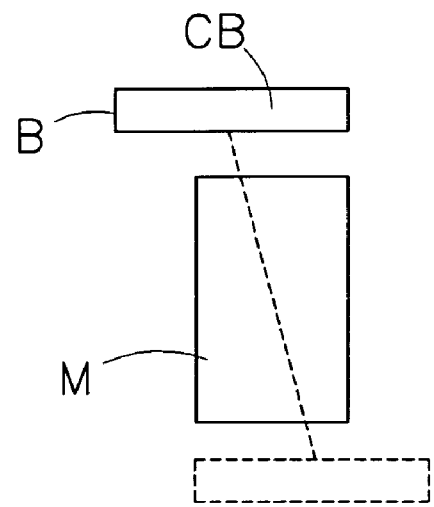

FIG. 4b shows a scanning path comprising a simple straight line, i.e., that is substantially linear, over its length. This is obtained by adding a velocity in y-direction to the scanning velocity in x-direction. Note that it suffices to add this velocity in y-direction, i.e., perpendicularly to the scanning velocity, since any adding to the scanning velocity of an additional velocity in x-direction comes down to changing the scanning velocity, although this of course has an effect on the angle of the scanning path with respect to the scanning direction. Although the velocity in y-direction, i.e., here the modulation direction, is limited, the total effect of smearing out inhomogeneities that are themselves constant during the scan is generally the same as in FIG. 4a, while the embodiment of FIG. 4b has the advantage that there are no turning points in the movement. Hence there will be less or no problems of (reaction) forces or vibrations due to the modulation.

Such a linear movement or scanning path does even smear out imperfections by dust particles, since such inhomogeneities are now distributed over the length of the scanning path, which is longer, in the present invention, than in the prior art scanning path. The larger the angle between (actual) scanning path and (general) scanning direction, the larger this effect will be.

Figure 4C:
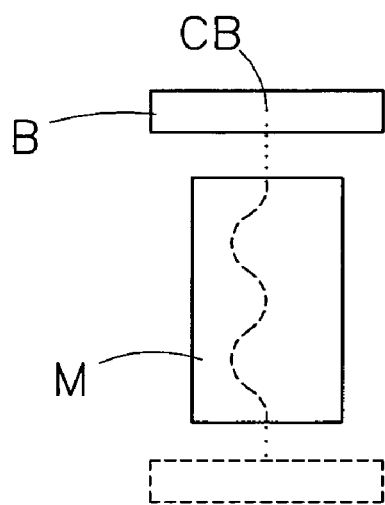

FIG. 4c diagrammatically shows an embodiment wherein the scanning path is substantially sinusoidal. This embodiment allows relatively high velocities of the modulation movement, wherein large reaction forces are yet avoided to a high degree. Such sinusoidal scanning path is but one example of the more general case of a scanning path having at least one point of reversal. Such scanning path prevents any inhomogeneity, be it a dust particle or other small inhomogeneity or a side wall reflection or any other inhomogeneity extending across all of the radiation beam in scanning direction, to be projected onto the substrate as a straight line or stripe. In every case such inhomogeneity is smeared out as a much less visible curve. In particular, such a scanning path is an oscillatory path, such as the mentioned sinusoidal path, but also a zigzag path etc.

Figure 4D:
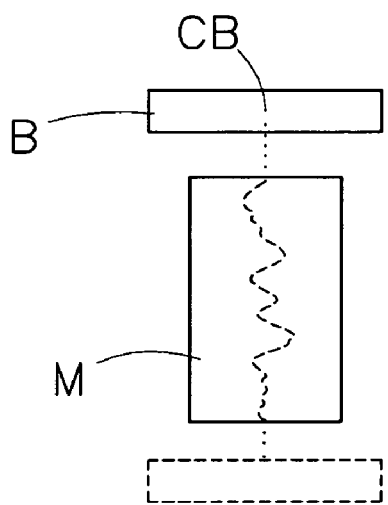

FIG. 4d diagrammatically shows an embodiment wherein the scanning path is random and/or noise-like. In some cases it is advantageous to make optimum use of the randomness of noise, and thereto the substrate table modulator and/or the support modulator may be connected to e.g. a random noise generator.

In the cases of FIGS. 4a through 4c it is easy to predict the path of the patterning device M with respect to the radiation beam B. Similarly, the path of the substrate table, according to a (de)magnified modulation movement added to the scanning movement, is also easy to predict. In these cases, it is possible to provide both the support modulator and the substrate table modulator (or, if these are each combined with the first positioner, the second positioner, respectively, to provide the respective combination of modulator and positioner) with separate and individual modulation instructions. In other words, the modulation of the one may be carried out independently of the modulation of the other. This prevents unwanted coupling between the two, which could give rise to vibrations etc.

In the case of FIG. 4d, the same design as above, i.e., with separate control of the two modulators, is possible when the irregular path is predetermined. However, if the path is actually determined only during the actual scan, then it is necessary to actually couple the substrate table modulator and support modulator, such that their respective modulation movements are coupled to still produce a sharp image on the substrate. This coupling may be a physical connection, or a sufficient control over the modulation movement of both modulators.

Note that any other scanning path that deviates from the prior art straight line in scanning direction can also provide improvement of the homogeneity. It is the modulation, i.e., the imparting a displacement in a non-scanning direction during at least a part of the complete projection of the patterned beam on the target portion of the substrate, which smears out and decreases inhomogeneities in the received dose on the target portion. Hence it is also possible to combine one or more of the mentioned scanning paths, or to provide a scanning path that comprises in part a prior art scanning path portion in scanning direction, and in part a scanning part portion in accordance with the present invention.

Furthermore, the amplitude or width of the scanning path in modulation direction, in particular in a direction perpendicular to the scanning direction, may be selected in dependence of the desired homogeneity, e.g., a large amplitude provides generally more smearing out, and a better homogeneity. E.g., a stripe with a width of 1 µm, and a "height" or dose variation, that is ten times the average background noise, may be effectively smeared out by an amplitude in the support scanning path during illumination of say 10 µm.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5–20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
   an illumination system configured to condition a radiation beam;
   a support constructed to support a patterning device, the patterning device being capable of imparting the radiation beam with a pattern in its cross-section to form a patterned radiation beam;
   a substrate table constructed to hold a substrate; and
   a projection system configured to project the patterned radiation beam onto a target portion of the substrate,
   wherein said substrate table is moveable in a scanning direction with respect to said support,
   wherein, during projecting the patterned radiation beam onto said target portion, said substrate table is moveable along a substrate table scanning path having an axis parallel to the scanning direction with a motion having a component in a direction perpendicular to the axis and crossing the axis at least twice.

2. The lithographic apparatus of claim 1, wherein, during projecting the patterned beam onto said target portion, said support is moveable in said scanning direction, along a support scanning path having a component perpendicular to the axis and crossing the axis at least twice.

3. The lithographic apparatus of claim 2, wherein said substrate table scanning path and said support scanning path have geometrically similar shapes.

4. The lithographic apparatus of claim 1, further comprising a substrate table modulator, configured to move said substrate table in a modulation direction during projecting the patterned beam onto the target portion.

5. The lithographic apparatus according to claim 4, further comprising a support modulator configured to move said support in said modulation direction during projecting the patterned beam onto the target portion.

6. The lithographic apparatus of claim 5, wherein said substrate table modulator and said support modulator are constructed to move said substrate table and said support, respectively, substantially synchronously.

7. The lithographic apparatus of claim 5, wherein the substrate table modulator is constructed and arranged to impart a predetermined substrate table movement to the substrate table.

8. The lithographic apparatus of claim 5, wherein the support modulator is constructed and arranged to impart a predetermined support movement to the support.

9. The lithographic apparatus of claim 1, wherein, during projecting the patterned beam onto said target portion, the substrate table is positionable in at least a first position and a second position at a predetermined non-zero distance along said motion having a component in a direction perpendicular to the axis.

10. The lithographic apparatus of claim 1, wherein at least a part of said substrate table scanning path is substantially linear.

11. The lithographic apparatus of claim 1, wherein at least a part of said substrate table scanning path is substantially sinusoidal.

12. The lithographic apparatus of claim 4, wherein at least a part of said substrate table scanning path is irregular.

13. The lithographic apparatus of claim 12, wherein the irregular path is noise-like.

14. A device manufacturing method comprising:
projecting a patterned beam of radiation onto a target portion of a substrate on a substrate table; and
during projecting said patterned beam onto said target portion, moving said substrate table in a scanning direction having an axis parallel to the scanning direction, with a motion having a component in a direction perpendicular to the axis and crossing the axis at least twice.

15. The method of claim 14, further comprising:
during the projecting, moving a support for a patterning device providing a pattern to the patterned beam in the scanning direction with a motion having a component in a direction perpendicular to the axis and crossing the axis at least twice.

16. The method of claim 15, wherein the support and the substrate table are moved substantially synchronously.

17. The method of claim 14, wherein during the projecting, said substrate table is positioned in a first position, said patterned beam is projected onto said target portion for a first time, subsequently said substrate table is moved into a second position, and said patterned beam is projected onto said target portion for a second time.

18. A device manufactured with the method of claim 14.

* * * * *